United States Patent [19]
Watanabe et al.

[11] Patent Number: 4,816,424
[45] Date of Patent: Mar. 28, 1989

[54] METHOD OF PRODUCING SEMICONDUCTOR DEVICE HAVING MULTILAYER CONDUCTIVE LINES

[75] Inventors: Kiyoshi Watanabe, Tokyo; Tohru Takeuchi; Hideaki Ohtake, both of Yokohama; Ichiro Fujita, Sagamihara, all of Japan

[73] Assignee: Fujitsu Limited, Kawasaki, Japan

[21] Appl. No.: 928,330

[22] Filed: Nov. 10, 1986

Related U.S. Application Data

[62] Division of Ser. No. 592,068, Mar. 22, 1984, abandoned.

[30] Foreign Application Priority Data

Mar. 25, 1983 [JP] Japan ................................ 58-49792

[51] Int. Cl.$^4$ ............................................. H01L 21/441
[52] U.S. Cl. ................................... 437/190; 437/192; 204/192.17; 204/192.25
[58] Field of Search ................. 204/192.17, 192.25; 148/DIG. 158, DIG. 20; 437/187, 190, 192

[56] References Cited

U.S. PATENT DOCUMENTS 3,723,838  3/1973  Kumagai ..................... 204/192.22
4,215,156  7/1980  Dalal et al. ...................... 427/84
4,374,912  2/1983  Kaneki et al. ...................... 430/5

FOREIGN PATENT DOCUMENTS 2402304   3/1979  France .
57-211269 12/1982  Japan .

OTHER PUBLICATIONS

Wittmer, "High-Temperature Contact Structures for Silicon Semiconductor Devices", Appl. Phys. Lett., 37(6), Sep. 1980, pp. 540–542.

Primary Examiner—Olik Chaudhuri
Attorney, Agent, or Firm—Staas & Halsey

[57] ABSTRACT

A triple-layer electrode structure or a multilayer interconnecting structure of a semiconductor device comprising a contact (a lower conductive) layer of aluminum or its alloy which comes into contact with a silicon substrate, a barrier layer of refractory metal nitride (e.g. titanium nitride) and refractory metal (e.g., tungsten), and a (upper) conductive layer of aluminum or its alloy. The TiN-W barrier layer prevents overdissolution of silicon into aluminum in spite of heat-treatment at a relatively elevated temperature. The barrier layer is formed by sintering a mixture of refractory metal nitride powder and refractory metal powder to form a target which is sputter deposited on the contact layer in an atomsphere excluding gaseous nitrogen.

3 Claims, 2 Drawing Sheets

METHOD OF PRODUCING SEMICONDUCTOR DEVICE HAVING MULTILAYER CONDUCTIVE LINES

This is a division of co-pending U.S. patent application Ser. No. 592,068, filed Mar. 22, 1984, now abandoned.

BACKGROUND OF THE INVENTION

1. Field of the Invention

The present invention relates to a semiconductor device, more particularly to a multilayer conductive line structure or a multilayer interconnecting structure of a semiconductor device.

2. Description of the Related Art

In production of a semiconductor device, such as a large-scale integrated circuit device (LSI) or very-large-scale integrated circuit device (VLSI), aluminum (Al) and aluminum alloy are widely used as the material for the electrodes and conductive lines. The Al alloy includes aluminum-silicon (Al—Si), aluminumcopper (Al—Cu), and aluminum-silicon-copper (Al—Si—Cu).

Al has advantages such as a lower electric resistance, a good adhesion to silicon dioxide ($SiO_2$), and a small contact resistance to silicon (Si), but has the disadvantage of easy reactivity on (i.e., easily alloying with) Si and gold (Au). During heat-treatment after the formation of an Al electrode, e.g., an annealing step or a hermetically-sealing step of packaging, Si of the semiconductor substrate dissolves (diffuses) into the Al of the electrode, which causes undesirable effects.

For example, in the case of a bipolar transistor having a shallow emitter, absorption of Si into the Al electrode causes a junction to be broken and generates a short-circuit between the emitter and base. This phenomenon is known as the "spike phenomenon". Furthermore, in the case of a Schottky barrier diode, for example, absorption causes its forward voltage to vary. Accordingly, when many Schottky barrier diodes are formed in a semiconductor device, scattering of their properties is caused.

In order to prevent such problems, it has been proposed to form an electrode coming into contact with a Si substrate surface through a contact window in an insulating film into a triple-layer structure. Such a triple-layer structure electrode comprises a first Al layer, a second refractory metal or its alloy layer, and a third Al layer. The refractory metal is titanium (Ti), tungsten (W), molybdenum (Mo), zirconium (Zr), chromium (Cr), hafnium (Hf), niobium (Nb), vanadium (V), nickel (Ni), platinum (Pt), tantalum (Ta), or palladium (Pd). The refractory metal alloy is, for example, TiW. In this case, the second layer serves as a barrier, since the refractory metal and its alloy do not react to either Al or Si. Therefore, the amount of Al absorbing Si is limited to the first Al layer only. Thus, the amount of dissolution of Si is limited, so as to prevent the above-mentioned undesirable phenomenon.

The adoption of the triple-layer electrode prevents overdiffusion of Si of the substrate into the Al layer, which makes it possible to carry out a heat-treatment of a semiconductor device with the formed triple-layer electrode at a temperature up to 450° C. without deterioration of its electrical properties.

However, for automation of the assembly of semiconductor devices, the devices preferably should be able to resist heating of approximately 500° C. At an elevated temperature, such as 500° C., the TiW barrier layer of the above-mentioned triple-layer electrode loses its barrier property, so that Si of the substrate overdiffuses into the third (upper) Al layer to cause the above-mentioned problems.

Furthermore, in the case of a multilayer interconnecting structure of a semiconductor device comprising, e.g., an Al electrode coming into contact with the Si substrate, an interlaminar insulating layer, and an upper Al conductive line connecting with the Al electrode through a contact window in the insulating layer, when the contact window formed in the interlaminar insulating layer is located over the contact region of the Si substrate, the volume of the Al portion on the contact region is largely increased. Therefore, the amount of dissolution of Si of the substrate into the Al portion is also largely increased, so that a junction formed in the Si substrate is very liable to break. In this case, formation of a conventional barrier layer of, e.g., the above-mentioned TiW between the Al electrode and the Al conductive line is effective for preventing the junction destruction. However, when the semiconductor device with the formed multilayer interconnecting structure is heated at approximately 500° C., again, the barrier property of the barrier (TiW) layer is lost, so that electrical properties of the semiconductor device deteriorate.

Accordingly, a titanium nitride (TiN) layer has been proposed as a barrier layer able to withstand an elevated temperature of approximately 500° C. However, the sputter target used for forming the TiN layer is very brittle and weak and may break during sputtering. Furthermore, the cost of the TiN target is very high. Therefore, this proportion lacks industrial practicality.

SUMMARY OF THE INVENTION

An object of the present invention is to provide a semiconductor device with improved heat resistance.

Another object of the present invention is to provide a barrier layer of a multilayer electrode structure or a multilayer interconnecting structure of a semiconductor device which does not lose its barrier property even at approximately 500° C.

Still another object of the present invention is to provide a method of forming an improved barrier layer.

According to the present invention, a barrier layer of a multilayer electrode structure or a multilayer interconnecting structure of a semiconductor device is made of a mixture of refractory metal nitride, such as TiN and refractory metal. The refractory metal is W, Ti, Zr, Hf, or Ta, and the refractory metal nitride is TiN, WN, ZrN, HfN, or TaN. The barrier layer is formed by sputtering a target which is made by mixing refractory metal nitride powder, such as TiN powder and refractory metal powder and sintering the mixed powder. When the TiN powder only is sintered, the density of a TiN target is from 50% to 60%. In accordance with the present invention, a mixture of TiN powder and refractory metal, e.g., W powder, is sintered to make a sintered TiN-W target having a density of from 70% to 80%. The sintered TiN-W target is tougher than a TiN target, and the service life of the TiN-W target is remarkably longer than that of the TiN target.

BRIEF DESCRIPTION OF THE DRAWINGS

The present invention will be more apparent from the description of the preferred embodiments set forth below with reference to the accompanying drawings, in which.

DESCRIPTION OF THE PREFERRED EMBODIMENTS

Figure 1:
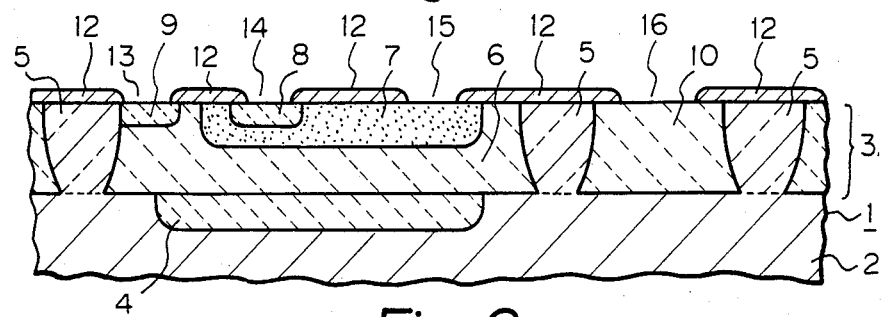
FIGS. 1 to 3 are schematic partially sectional views of a semiconductor device with a triple-layer electrode structure in various stages of production according to an embodiment of the present invention.
Figure 2:
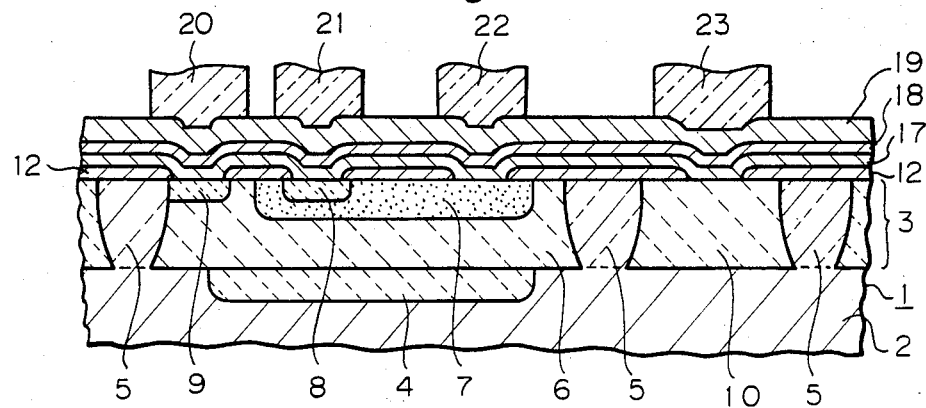
Figure 3:
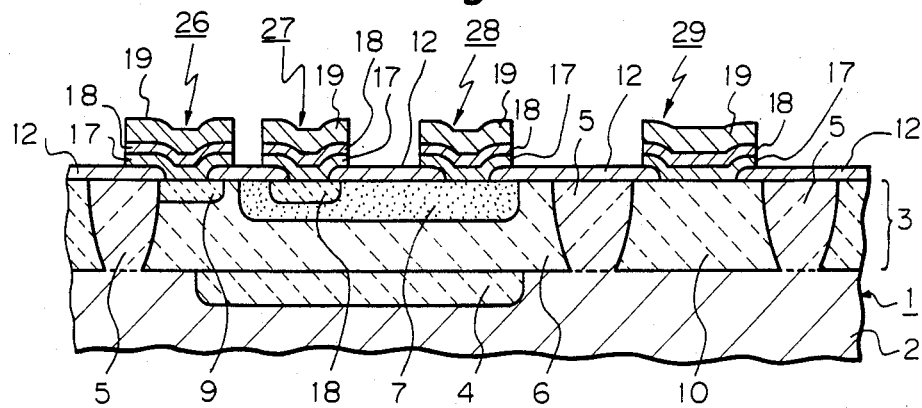

Referring to FIGS. 1 to 3, an explanation will be made of a process for production of a semiconductor device comprising an NPN-type bipolar transistor and a Schottky barrier diode which have a triple-layer electrode structure according to the present invention.

As illustrated in FIG. 1, a Si substrate 1 comprises a Si single crystalline substrate 2 and a Si epitaxial layer 3 formed thereon. An N+-type buried layer 4, an P-type isolation region 5 surrounding an N-type collector region 6, a P-type base region 7, an N-type emitter region 8, and an N-type collector contact region 9 for the NPN-type bipolar transistor are formed in the Si substrate 1 in accordance with a conventional formation process. An N-type region 10 for the Schottky barrier diode (i.e., a portion of the epitaxial layer 3) is defined by the isolation region 5. An insulating film 12 of $SiO_2$ covering the Si substrate 1 and having a collector contact window 13, an emitter contact window 14, a base contact window 15, and a contact window 16 is formed in accordance with a conventional formation process.

Next, as illustrated in FIG. 2, a lower conductive layer 17 of, e.g., Al or its alloy is formed so as to cover the insulating film 12 and the Si exposed surface portions with the windows 13 to 16 by a sputtering method or a vacuum evaporation method. According to the present invention, a barrier layer 18 of a mixture of TiN and a refractory metal, e.g., W, is formed on the lower Al layer 17 by a suitable sputtering method, e.g., a magnetron sputtering method. In this case, a sputter target is made by mixing TiN powder and W powder and sintering the mixed powder. The refractory metal, such as W, Ti, Zr, Hf, and Ta, having a lower melting point than that of TiN, serves as a binder, which makes the sintered target tougher and denser. It is confirmed that the mixing ratio of TiN and W is maintained in the deposition layer, i.e., barrier layer 18. The amount of TiN in the TiN-W target is determined within the range of from 90 wt %, the upper limit for maintaining the toughness, to 10 wt %, the lower limit for providing a sufficient barrier property. Then, an upper conductive layer 19 of, e.g., Al or its alloy, is formed on the barrier layer 18 by a sputtering method or a vacuum evaporation method.

Next, a resist layer is applied on the upper conductive layer 19, exposed, and developed to form a predetermined resist pattern comprising resist portions 20, 21, 22, and 23 (FIG. 2). The resist portions 20, 21, 22, and 23 are located over the contact windows 13, 14, 15, and 16, respectively.

Thereafter, using the resist pattern as a mask, the upper conductive layer 19, the barrier layer 18, and the lower conductive layer 17 are selectively etched by a suitable etching method to form a collector electrode 26, an emitter electrode 27, a base electrode 28, and a contact electrode 29, as illustrated in FIG. 3. The etching is carried out by, e.g., a dry etching process using an etchant gas containing chlorine, such as carbon tetrachloride ($CCl_4$), boron trichloride ($BCl_3$), and chlorine ($Cl_2$). Then, the resist pattern is removed. Thus the electrodes 26, 27, 28, and 29 having a triple-layer structure are completed.

In a case where the triple-layer electrode structure is made of the Al layer 17, the TiN-W barrier layer 18, and the Al layer 19, it is preferable that the thickness of the Al layer 17 be from 50 to 200 nm, the thickness of the barrier layer 18 be more than 10 nm, and the thickness of the Al layer 19 be at least 500 nm for increasing the electrical resistance of the electrodes.

EXAMPLE 1

On a Si substrate 1 having a base region 7 approximately 0.9 μm deep and an emitter region 8 approximately 0.7 μm deep, as illustrated in FIG. 3, electrodes 26, 27, and 28 of a bipolar transistor and an electrode 29 of a Schottky barrier diode having a triple-layer structure were formed in the above-mentioned manner. The triple-layer electrodes consisted of the Al layer 17, 100 nm thick, the TiN-W barrier layer 18, 100 nm thick, and the Al layer 19, 650 nm thick. In the case of the 20 transistors and 20 diodes (Samples A of the present invention), the TiN content of the barrier layer was approximately 10 wt %. In the case of another 20 transistors and 20 diodes (Samples B of the present invention), the TiN content was approximately 80 wt %. As comparative samples of the prior art, 20 bipolar transistors and 20 Schottky barrier diodes having the same triple-layer electrode structure, except that the barrier layer 18 was made of TiW, were formed. Samples A, Samples B, and the comparative samples were annealed under an atmosphere of nitrogen ($N_2$) at a temperature of 450° or 500° C. for approximately 30 minutes. After the annealing, the triple-layer electrode structure and electrical properties of the transistors and diodes were tested to obtain the following results.

Test A

In order to observe whether or not the barrier layer 18 exists after heat-treatment, the upper Al layer 19 was etched so as to expose the barrier layer 18. The observation was performed by using a microscope to obtain the results shown in Table 1.

TABLE 1

| Samples | Fraction defective | |
|---|---|---|
| | 450° C. | 500° C. |
| Comparative samples | 0/20 | 20/20 |
| Invention | | |
| Samples A | 0/20 | 2/20 |
| Samples B | 0/20 | 0/20 |

As shown in Table 1, at 450° C., no defects occurred among the samples. At 500° C., while all of the comparative samples lost the barrier layer, none of Samples B lost the barrier layer. In the case of Samples A having the low TiN content, two among 20 samples lost the barrier layer. These results shown that the TiN content in the barrier layer should be at least 10 wt % and that it is preferable to increase the TiN content to 80 wt %.

Test 2

Occurrence of short-circuits between the emitters and bases (i.e., poor emitter-base breakdown voltage) of the bipolar transistors of Samples A and B and the comparative samples, annealed at 500° C., were examined to obtain the rates shown in Table 2.

TABLE 2

| Samples | Occurrence of emitter-base short-circuits |
|---|---|
| Comparative samples | 20/20 |
| Invention | |
| Samples A | 2/20 |
| Samples B | 1/20 |

In all of the comparative samples, the PN junction was broken and the transistors failed. On the other hand, only two among 20 of Samples A and one among 20 of Samples B failed. Thus, the use of the TiN-W barrier layer according to the present invention can remarkably reduce emitter-base short-circuits.

Test 3

Figure 4:
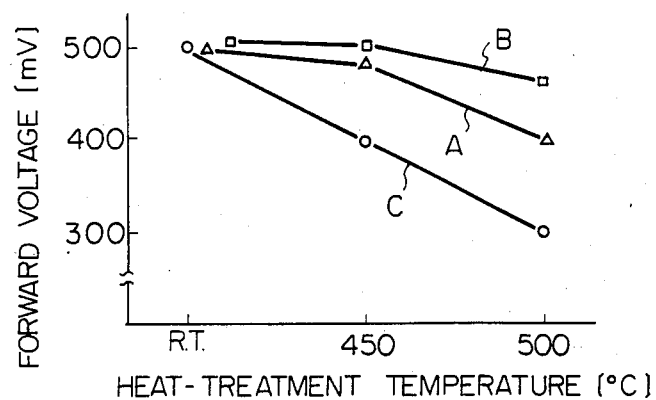
FIG. 4 is a graph showing the relationship between forward voltages of Schottky barrier diodes and heat-treatment temperatures.

The forward voltages $V_F$ of the Schottky barrier diodes of Samples A and B and the comparative samples were measured to obtain the results shown in FIG. 4. In FIG. 4, symbol R.T. indicates no annealing, and solid lines A, B, and C indicate Samples A, Samples B, and the comparative samples, respectively. As can be seen from FIG. 4, the forward voltage $V_F$ of the comparative samples is reduced by approximately 200 mV at 500° C. annealing. The reduction of the forward voltage of Samples A and B is from 50 to 100 mV, which means that the TiN-W barrier layer according to the present invention inhibits overdiffusion (overdissolution) of Si of the substrate into the electrode.

Figure 5:
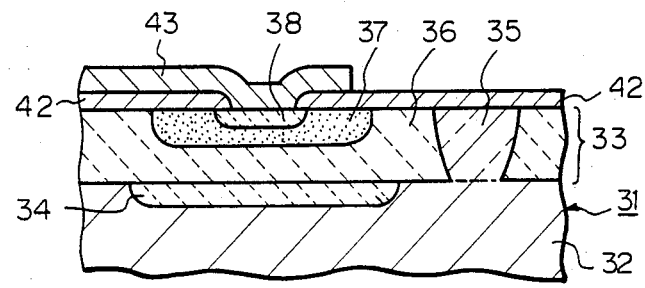
FIGS. 5 to 7 are schematic partially sectional views of a semiconductor device with a multilayer interconnecting structure according to another embodiment of the present invention.
Figure 6:
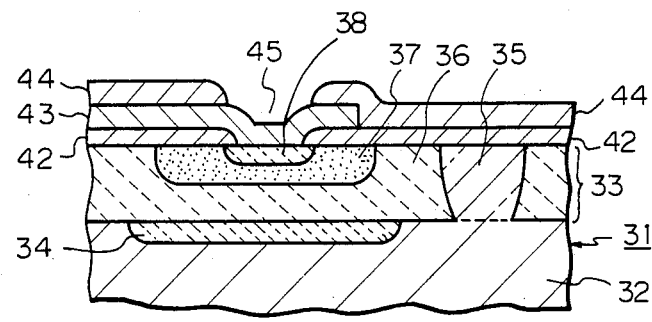
Figure 7:
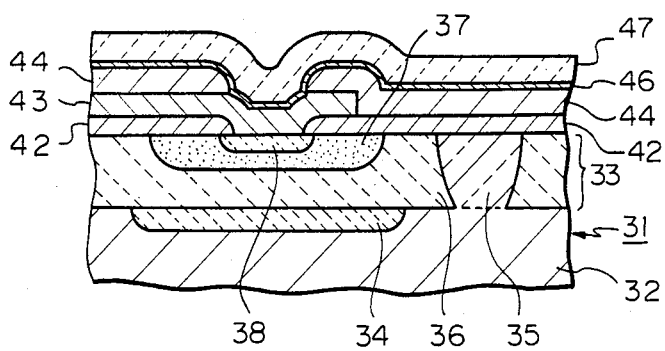

Referring to FIGS. 5 to 7, an explanation will be made of a process for production of a semiconductor device comprising a bipolar transistor and provided with a multilayer interconnecting structure according to another embodiment of the present invention.

As illustrated in FIG. 5, a Si substrate 31 comprises a Si single crystalline substrate 32 and a Si epitaxial layer 33 formed thereon. A buried layer 34, an isolation region 35, a collector region 36, a base region 37, an emitter region 38, and a collector contact region (not shown) for the bipolar transistor are formed in accordance with a conventional formation process. An insulating film 42 of $SiO_2$ covering the Si substrate 31 and having an emitter contact window, a base contact window (not shown), and a collector contact window (not shown) is formed in accordance with a conventional formation process. Then, conductive material, e.g., Al or its alloy, is deposited on the exposed surface by a sputtering method or a vacuum evaporation method and is selectively etched by a conventional lithography process to form a lower (first) conductive layer, i.e., an emitter electrode layer 43 (FIG. 5) having a thickness of, e.g., from 0.8 to 1 μm.

Next, as illustrated in FIG. 6, an interlaminar insulating layer 44 of $SiO_2$ or phosphosilicate glass (PSG) is formed on the lower conductive layer 43 and the insulating layer 42. A contact (through) hole 45 is opened in the interlaminar insulating layer 44 at a position over the emitter region 38 by a conventional lithography process. It is possible to open the contact hole at another position. However, the position over the emitter region means the most disadvantageous condition for free design.

Then, as illustrated in FIG. 7, a TiN-W barrier layer 46 according to the present invention is formed on the interlaminar insulating layer 44 and the exposed lower conductive layer in the contact hole 45 by a sputtering method. An upper (second) conductive layer 47 of, e.g., Al or its alloy having a thickness of, e.g., from 1 to 1.5 μm is formed on the barrier layer 46 by a sputtering method or a vacuum evaporation method. The upper conductive layer 47 and the barrier layer 46 are selectively etched in accordance with a conventional lithography method to pattern them. Thus a desired multilayer interconnecting is completed in which the upper conductive layer 47 is connected to the lower conductive layer 43 through the TiN-W barrier layer 46.

In the above-mentioned case, the TiN-W barrier layer is provided on the bottom surface of the upper conductive layer 47, but it may be provided on the top surface of the lower conductive layer 43.

EXAMPLE 2

Bipolar transistors with a multilayer interconnecting structure, illustrated in FIG. 7, were produced in the above-mentioned manner. A Si substrate 1 had a base region 37 approximately 0.9 μm deep and an emitter region 38 approximately 0.7 μm deep. The multilayer interconnecting structure consisted of a lower Al layer 43 approximately 1 μm thick, a TiN-W barrier layer 46 of 100 nm and an upper Al layer 47 of approximately 1.5 μm. In the case of 20 transistors (Samples D of the present invention), the TiN content of the barrier layer was approximately 10 wt %. In the case of another 20 transistors (Sample E of the present invention), the TiN content was approximately 80 wt %. As comparative samples of the prior art, 20 bipolar transistors having the same structure except that the barrier layer 46 was made of TiW were produced. Samples D, Samples E, and the comparative samples were annealed under an atmosphere of $N_2$ at a temperature of 500° C. for approximately 30 minutes. After the annealing, the bipolar transistors were tested to examine whether or not the emitter-base short-circuit occurs. The obtained results are shown in Table 3.

TABLE 3

| Samples | Occurrence of emitter-base short-circuits |
|---|---|
| Comparative samples | 20/20 |
| Invention | |
| Samples D | 10/20 |
| Samples E | 4/20 |

As can be seen from Table 3, in the case of all the comparative samples, an emitter-base short-circuit occurred, namely, the PN junction between the emitter region and the base region broke. On the other hand, only 10 among the 20 Samples D and four among the 20 Samples E had the emitter-base short-circuit. Therefore, it is obvious that the TiN-W barrier layer according to the present invention has a superior function as a stopper to overdissolution of Si into Al as compared with the TiW barrier layer of the prior art.

It will be obvious that the present invention is not restricted to the above-mentioned embodiments and examples and that many variations are possible for persons skilled in the art without departing from the scope of the invention. For example, when gold (Au) is used for the conductor layer in a triple-layer electrode structure or for the second layer in a multilayer interconnecting structure, the TiN-W layer can be used for preventing alloying of an Al layer and the Au layer. It is possible to use platinum for the first conductor layer and for the second conductor layer. It is also possible to use metal silicide, such as platinum silicide, tungsten silicide, titanium silicide, and molybdenum silicide for the contact layer and the lower conductive layer instead of Al and its alloy. Furthermore, the present invention can be applied not only to a bipolar transistor and a Schottky barrier diode but also to any other active and passive elements.

We claim:

1. A method of forming a multilayer structure of a semiconductor device comprising a contact layer in contact with a semiconductor substrate, a barrier layer formed on the contact layer and a conductive layer formed on the barrier layer, comprising the steps of:

(a) mixing refractory metal nitride powder and refractory metal powder to produce a refractory metal nitride mixture;

(b) sintering the refractory metal nitride mixture to form a target of combined refractory metal nitride; and (c) sputtering the target in an atmosphere substantially excluding nitrogen gas to deposit the combined refractory metal nitride on the contact layer.

2. The method according to claim 1, wherein said refractory metal is a metal selected from the group consisting of tungsten, titanium, zirconium, hafnium, and tantalum.

3. A method according to claim 1, further comprising the step of supplying quantities of the refractory metal nitride powder and the refractory metal powder to be mixed in step (a) so that the refractory metal nitride mixture includes the refractory metal nitride powder in a range of 10 to 90 percent by weight.

* * * * *